United States Patent
Kao

(10) Patent No.: US 7,564,277 B2
(45) Date of Patent: Jul. 21, 2009

(54) CONTROL CIRCUITS

(75) Inventor: Peng-Feng Kao, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 284 days.

(21) Appl. No.: 11/790,027

(22) Filed: Apr. 23, 2007

(65) Prior Publication Data
US 2008/0143310 A1 Jun. 19, 2008

(30) Foreign Application Priority Data
Dec. 15, 2006 (TW) .............................. 95147291 A

(51) Int. Cl.
*H03K 4/02* (2006.01)
(52) U.S. Cl. .................. 327/126; 327/518; 318/400.26; 323/273
(58) Field of Classification Search ................. 327/108, 327/538, 539, 126, 158, 541; 323/268, 273, 323/281–285, 299, 300, 315; 318/400.04, 318/400.26, 432, 434, 560, 254
See application file for complete search history.

(56) References Cited

U.S. PATENT DOCUMENTS

| | | | | |
|---|---|---|---|---|
| 5,311,069 A * | 5/1994 | Austin | ......................... | 327/261 |
| 5,929,696 A * | 7/1999 | Lim et al. | .................... | 327/540 |
| 6,285,146 B1 * | 9/2001 | Harlan | .................. | 318/400.04 |
| 6,388,433 B2 * | 5/2002 | Marty | ......................... | 323/284 |
| 6,819,094 B2 * | 11/2004 | Barcelo et al. | .............. | 323/316 |
| 7,224,135 B1 * | 5/2007 | Menegoli et al. | ........ | 318/400.26 |

* cited by examiner

*Primary Examiner*—Rajnikant B Patel
(74) *Attorney, Agent, or Firm*—Geissler, Olds & Lowe, PLLC

(57) ABSTRACT

A control circuit for controlling a motor. The control circuit includes a control module, a current transformation module and a comparison module. The control module generates a control current and a comparison voltage according to a first current, a first voltage and an input voltage. The current transformation module, coupled to the control module, generates a first output voltage from a first output terminal and a second output voltage from a second output terminal. The comparison module, coupled to the control module and the current transformation module, compares a threshold voltage, the first output voltage, the second output voltage, and the comparison voltage and generates a plurality of control signals to control the motor.

13 Claims, 3 Drawing Sheets

US 7,564,277 B2

CONTROL CIRCUITS

BACKGROUND OF THE INVENTION

1. Field of the Invention

The invention relates to control circuits, and more particularly to circuits controlling rotation of motors in motor systems.

2. Description of the Related Art

FIG. 1 is a schematic diagram of a conventional printer motor system. In FIG. 1, printer motor system 10 usually comprises a control circuit 12, a pre-driver circuit 14, an H-bridge circuit 16 and a motor 18. Control circuit 12 generates a plurality of control signals 13 to pre-driver circuit 14. Pre-driver circuit 14 generates a plurality of driving signals 15 to H-bridge circuit 16 according to the control signals 13. H-bridge circuit 16 generates control signals 17 corresponding to driving signals 15 to control the rotation of motor 18.

However, the print quality of printer motor system 10 is influenced by the accuracy of the rotation speed and the initial position of motor 18. For example, printing position is shifted when the initial position of motor 18 is in error, affecting quality of the printed document. Thus, printing quality of printer motor system 10 is increased when the rotation speed and the initial position of motor 18 is controlled accurately, making accurate generation of control signals 13 using control circuit 12 a priority.

BRIEF SUMMARY OF THE INVENTION

Control circuits for controlling rotation of motors are provided. An exemplary embodiment of a control circuit includes a control module, a current transformation module and a comparison module. The control module generates a control current and a comparison voltage according to a first current, a first voltage and an input voltage. The current transformation module coupled to the control module generates a first output voltage from a first output terminal and a second output voltage from a second output terminal. The comparison module coupled to the control module and the current transformation module compares a threshold voltage, the first output voltage, the second output voltage, and the comparison voltage and generates a plurality of control signals to control the rotation of the motor.

In addition, an exemplary embodiment of the control circuit is a one-shot circuit to provide a stable control signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
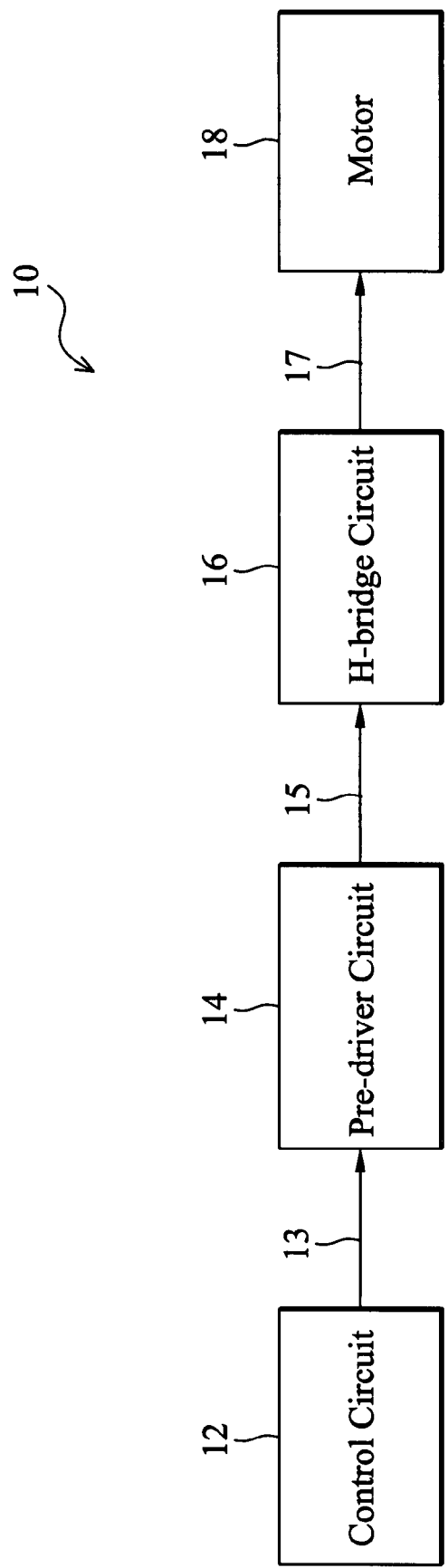
FIG. 1 is a schematic diagram of a conventional printer motor system.
Figure 2:
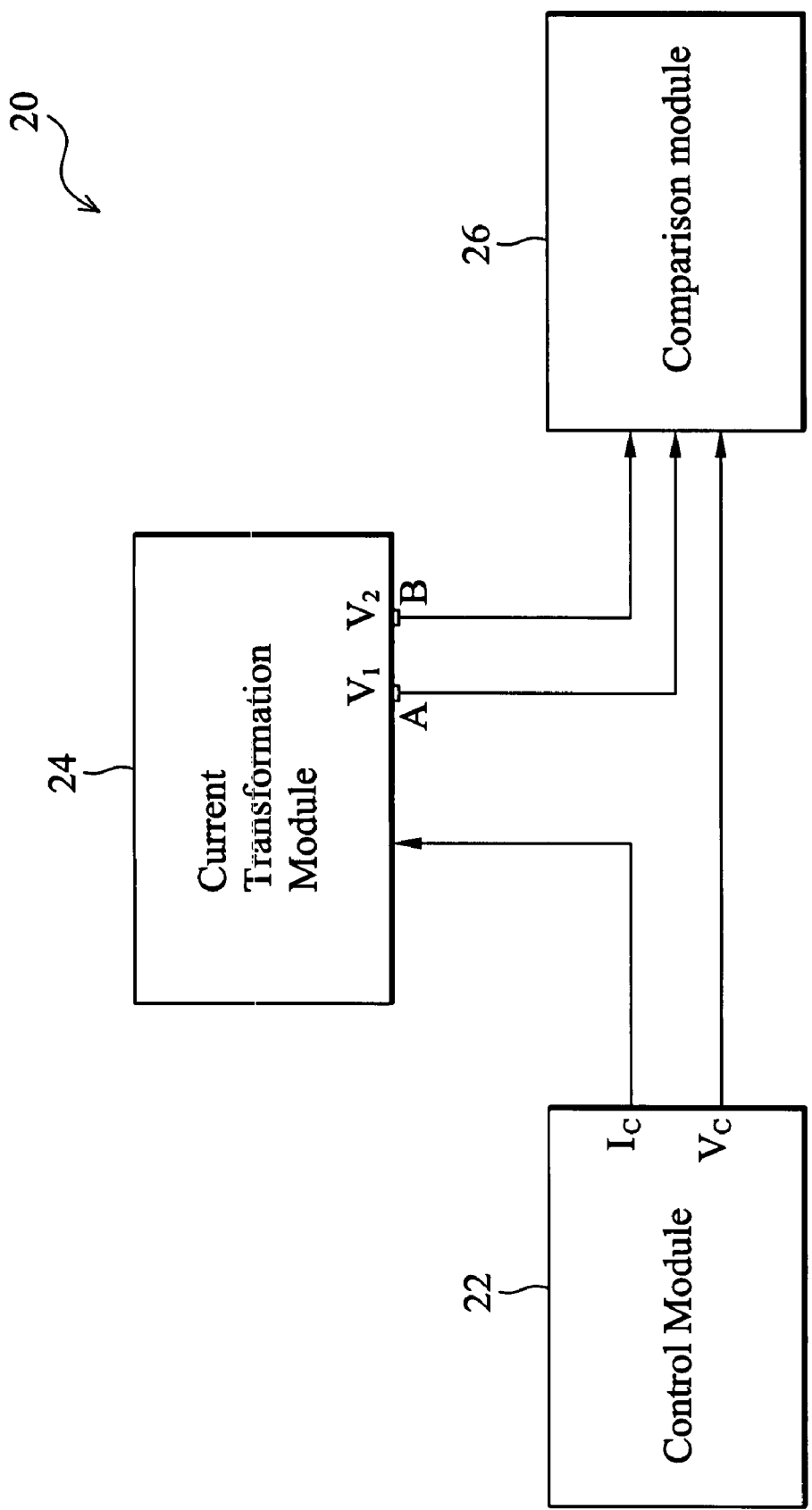
FIG. 2 is a schematic diagram of a control circuit according to an embodiment of the invention.

FIG. 2 is a schematic diagram of a control circuit according to an embodiment of the invention. The control circuit 20 according to an embodiment of the invention controls the rotation of a motor (not shown). In FIG. 2, control circuit 20 comprises a control module 22, a current transformation module 24 and a comparison module 26. Control module 22 generates a control current $I_C$ and a comparison voltage $V_C$ according to a first current, a first voltage, and an input voltage. Current transformation module 24, connected to control module 22, comprises a first output terminal A and a second output terminal B. Current transformation module 24 generates a first output voltage $V_1$ from first output terminal A and a second output voltage $V_2$ from second output terminal B according to a second voltage, a reference voltage and control current $I_C$. Comparison module 26, connected to control module 22 and current transformation module 24, generates a plurality of control signals to control the rotation of a motor (not shown) by the comparison of a threshold voltage, first output voltage $V_1$, second output voltage $V_2$, and comparison voltage $V_C$.

Figure 3:
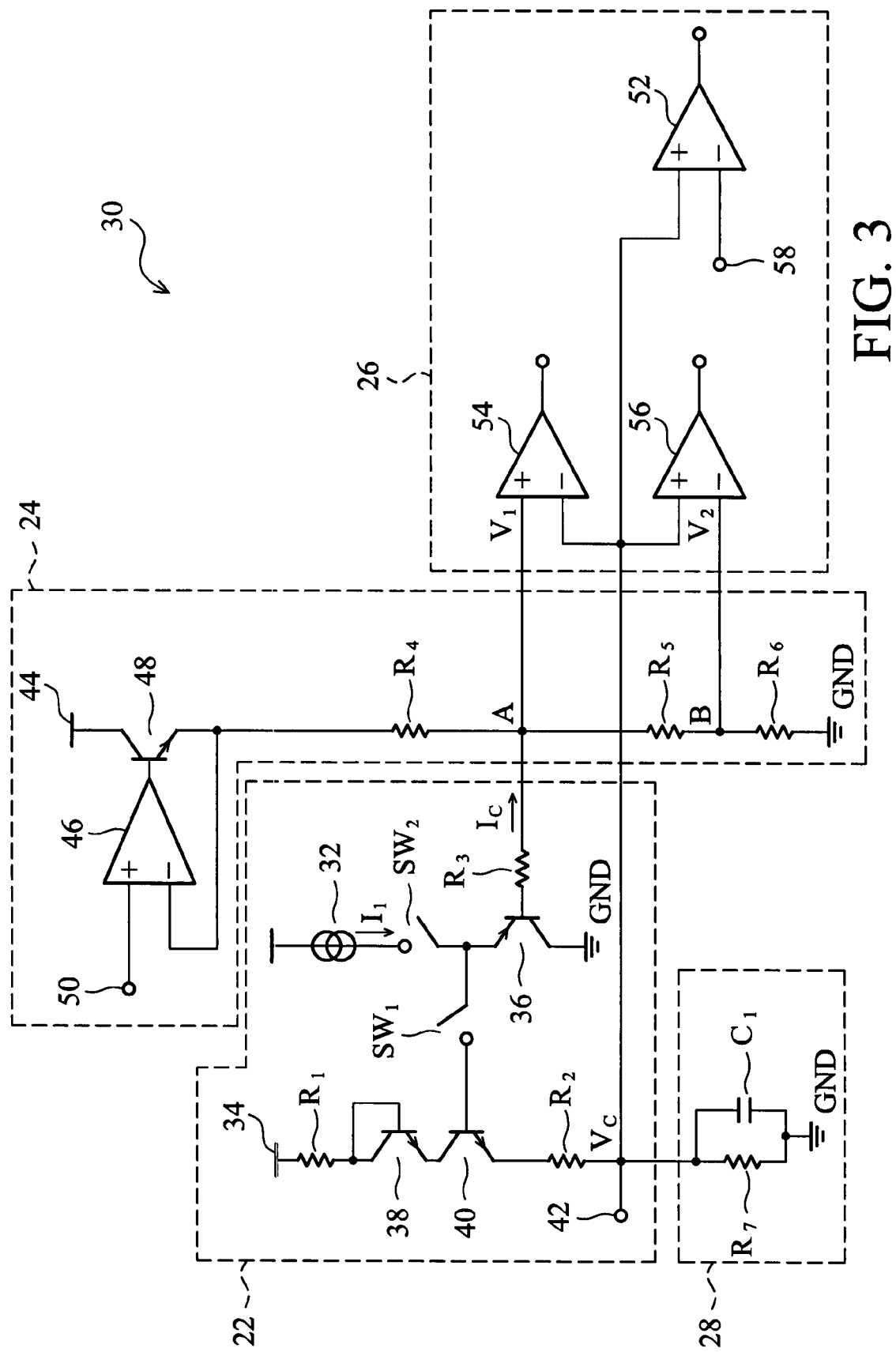
FIG. 3 is a schematic block diagram of a control circuit according to an embodiment of the invention.

FIG. 3 is a schematic block diagram of a control circuit according to an embodiment of the invention. In the control circuit 30 according to an embodiment of the invention, control module 22 comprises a constant current source 32, a first voltage source 34, a first transistor 36, a second transistor 38 and a third transistor 40. Constant current source 32 provides the first current $I_1$. First voltage source 34 provides the first voltage. The emitter of first transistor 36 is connected to constant current source 32, the base of first transistor 36 is connected to first output terminal A, and the collector of first transistor 36 is connected to a grounding node GND. The collector of second transistor 38 is connected to first voltage source 34, and the base and the collector of second transistor 38 are connected. The collector of third transistor 40 is connected to the emitter of second transistor 38, the base of third transistor 40 is connected to the emitter of first transistor 36, and the emitter of third transistor 40 is connected to the input voltage 42.

In an embodiment of the invention, control module 22 further comprises a first switch $SW_1$ and a second switch $SW_2$. First switch $SW_1$ is connected between the base of third transistor 40 and the emitter of first transistor 36. Second switch $SW_2$ is connected between constant current source 32 and first switch $SW_1$. First switch $SW_1$ and second switch $SW_2$ of control module 22 are simultaneously turned on or off according to a switch control signal for passing currents. In addition, control module 22 further comprises a first resistor $R_1$, a second resistor $R_2$ and a third resistor $R_3$. First resistor $R_1$ is connected between first voltage source 34 and the collector of second transistor 38, second resistor $R_2$ is connected between the emitter of third transistor 40 and input voltage 42, and third resistor $R_3$ is connected between the base of first transistor 36 and first output terminal A.

Referring to FIG. 3, in the control circuit 30 according to an embodiment of the invention, current transformation module 24 comprises a second voltage source 44, an amplifier 46, a fourth transistor 48, a fourth resistor $R_4$, a fifth resistor $R_5$ and a sixth resistor $R_6$. Second voltage source 44 provides the second voltage. Amplifier 46 comprises a non-inverting input terminal, an inverting input terminal, and an output terminal. The non-inverting input terminal of amplifier 46 receives a reference voltage 50. Amplifier 46 amplifies reference voltage 50 and outputs the amplified reference voltage 50 from its output terminal. The collector of fourth transistor 48 is connected to second voltage source 44, the base of fourth transistor 48 is connected to the output terminal of amplifier 46, and the emitter of fourth transistor 48 is connected to the inverting input terminal of amplifier 46. Fourth resistor $R_4$ is connected to the emitter of fourth transistor 48 and first output terminal A. Fifth resistor $R_5$ is connected between first output terminal A and second output terminal B. Sixth resistor $R_6$ is connected to second output terminal B and grounding node GND.

Referring to FIG. 3, in the control circuit 30 according to an embodiment of the invention, comparison module 26 comprises a first comparator 52, a second comparator 54 and a third comparator 56. The non-inverting input terminal of first comparator 52 is connected to input voltage, 42, and the inverting input terminal of first comparator 52 is connected to threshold voltage 58. First comparator 52 compares comparison voltage $V_C$ with threshold voltage 58 and generates a first control signal. In an embodiment, the motor (not shown) switches in a plurality of predetermined operating modes according to the first control signal. For example, the predetermined operating modes can be motor-current attenuation modes. The non-inverting input terminal of second comparator 54 is connected to first output terminal A, and the inverting input terminal of second comparator 54 is connected to input voltage 42. Second comparator 54 compares comparison voltage $V_C$ with first output voltage $V_1$ and generates a second control signal. The non-inverting input terminal of third comparator 56 is connected to input voltage 42, and the inverting input terminal of third comparator 56 is connected to second output terminal B. Third comparator 56 compares comparison voltage $V_C$ with second output voltage $V_2$ and generates a third control signal.

In addition, the control circuit 30 according to an embodiment of the invention further comprises an adjustment module 28. Adjustment module 28 is connected to control module 22 and adjusts comparison voltage $V_C$. Adjustment module 28 comprises a seventh resistor $R_7$ and a first capacitor $C_1$. In this embodiment, adjustment module 28 adjusts comparison voltage $V_C$ by charging or discharging first capacitor $C_1$.

In an embodiment of the invention, control circuit 30 controls the motor in a printer, and the control circuit 30 can be a one-shot circuit controlling the motor in the printer. When the control circuit 30 operates in a normal operating mode, first switch $SW_1$ and second switch $SW_2$ are turned off by a switch control signal. At this phase, first output voltage $V_1$ and second output voltage $V_2$ respectively of first output terminal A and second output terminal B are 0.8V and 0.4V, and comparison voltage $V_C$ is kept at 0.9V by adjustment module 28. When the control circuit 30 operates in a current attenuation mode, first capacitor $C_1$ in adjustment module 28 is discharged until comparison voltage $V_C$ drops to second output voltage $V_2$ (0.4V). At this phase, first switch $SW_1$ and second switch $SW_2$ are turned on by the switch control signal to charge first capacitor $C_1$ in adjustment module 28. The signal levels respectively at output terminals of third comparator 56 and second comparator 54 are changed respectively when comparison voltage $V_C$ reaches second output voltage $V_2$ (0.4V) and first output voltage $V_1$ (0.8V). Thus, second control signal and third control signal are generated respectively from output terminals of second comparator 54 and third comparator 56 to control the subsequent pre-driver circuit, and further control the operation of the motor. First comparator 52 compares comparison voltage $V_C$ with threshold voltage 58, and outputs a first control signal according to the comparison result. Thus, current modes of the motor are selected according to the first control signal output from first comparator 52.

Accordingly, the control circuit according to an embodiment of the invention generates a first output voltage and a second output voltage by current transformation module and control module, and the comparison module generates a plurality of control signals to control the motor of the printer by comparing voltage levels. Thus, the print quality of the printer is improved by controlling the printer motor.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A control circuit for controlling rotation of a motor, comprising:
   a control module generating a control current and a comparison voltage according to a first current, a first voltage and an input voltage;
   a current transformation module coupled to the control module comprising a first output terminal and a second output terminal, and generating a first output voltage from the first output terminal and a second output voltage from the second output terminal according to a second voltage, a reference voltage and the control current; and
   a comparison module coupled to the control module and the current transformation module, generating a plurality of control signals to control the rotation of the motor by the comparison of a threshold voltage, the first output voltage, the second output voltage, and the comparison voltage.

2. The control circuit as claimed in claim 1, wherein the control module comprises:
   a constant current source providing the first current;
   a first voltage source providing the first voltage;
   a first transistor, wherein the emitter of the first transistor is coupled to the constant current source, the base of the first transistor is coupled to the first output terminal, and the collector of the first transistor is coupled to a grounding node;
   a second transistor, wherein the collector of the second transistor is coupled to the first voltage source, and the base and the collector of the second transistor are connected; and
   a third transistor, wherein the collector of the third transistor is coupled to the emitter of the second transistor, the base of the third transistor is coupled to the emitter of the first transistor, and the emitter of the third transistor is coupled to the input voltage.

3. The control circuit as claimed in claim 2, wherein the control module further comprises:
   a first switch coupled between the base of the third transistor and the emitter of the first transistor; and
   a second switch coupled between the constant current source and the first switch.

4. The control circuit as claimed in claim.3, wherein the first switch and the second switch are simultaneously turned on or off according to a switch control signal.

5. The control circuit as claimed in claim 2, wherein the control module further comprises:
   a first resistor coupled between the first voltage source and the collector of the second transistor;
   a second resistor coupled between the emitter of the third transistor and the input voltage; and a third resistor coupled between the base of the first transistor and the first output terminal.

6. The control circuit as claimed in claim 1, wherein the current transformation module comprises:
    a second voltage source providing the second voltage;
    an amplifier amplifying a reference voltage, comprising a non-inverting input terminal receiving the reference voltage, an inverting input terminal and an output terminal outputting the amplified reference voltage;
    a fourth transistor, wherein the collector of the fourth transistor is coupled to the second voltage source, the base of the fourth transistor is coupled to the output terminal of the amplifier, and the emitter of the fourth transistor is coupled to the inverting input terminal of the amplifier;
    a fourth resistor coupled to the emitter of the fourth transistor and the first output terminal;
    a fifth resistor coupled between the first output terminal and the second output terminal; and
    a sixth resistor coupled to the second output terminal and the grounding node.

7. The control circuit as claimed in claim 1, wherein the comparison module comprises:
    a first comparator comparing the comparison voltage with the threshold voltage and generating a first control signal, wherein a non-inverting input terminal of the first comparator is coupled to the input voltage, and the inverting input terminal of the first comparator is coupled to the threshold voltage;
    a second comparator comparing the comparison voltage with the first output voltage and generating a second control signal, wherein the non-inverting input terminal of the second comparator is coupled to the first output terminal, and the inverting input terminal of the second comparator is coupled to the input voltage; and
    a third comparator comparing the comparison voltage with the second output voltage and generating a third control signal, wherein the non-inverting input terminal of the third comparator is coupled to the input voltage, and the inverting input terminal of the third comparator is coupled two the second output terminal.

8. The control circuit as claimed in claim 7, wherein the first control signal controls the motor switching in a plurality of predetermined operating modes.

9. The control circuit as claimed in claim 1, further comprising an adjustment module coupled to the control module and adjusting the comparison voltage.

10. The control circuit as claimed in claim 9, wherein the adjustment module comprises a seventh resistor and a first capacitor.

11. The control circuit as claimed in claim 10, wherein the adjustment module adjusts the comparison voltage by charging or discharging the first capacitor.

12. The control circuit as claimed in claim 1, wherein the motor is operated in a printer.

13. The control circuit as claimed in claim 1, wherein the control circuit is a one-shot circuit.

* * * * *